United States Patent [19]

Lee

[11] Patent Number: 4,847,566
[45] Date of Patent: Jul. 11, 1989

[54] CMOS AMPLIFIER HAVING ENHANCED CURRENT SINKING AND CAPACITANCE LOAD DRIVE

[75] Inventor: Min-Ru Lee, San Jose, Calif.

[73] Assignee: Linear Technology Corporation, Milpitas, Calif.

[21] Appl. No.: 154,070

[22] Filed: Feb. 9, 1988

[51] Int. Cl.[4] .............................................. H03F 3/45
[52] U.S. Cl. .................................. 330/253; 330/261
[58] Field of Search ............... 330/252, 253, 260, 261, 330/258

[56] References Cited

U.S. PATENT DOCUMENTS 4,720,685  1/1980  Garuts ................................. 330/253

Primary Examiner—Gene Wan
Attorney, Agent, or Firm—Flehr, Hohbach, Test, Albritton & Herbert

[57] ABSTRACT

The stability of an amplifier output stage in driving a capacitive load and sinking increasing currents is enhanced by compensating for a reduction in $V_{BE}$ of a first emitter follower bipolar transistor connected to the amplifier output. This is accomplished by using a second emitter follower transistor with the two emitter follower transistors driving a differential amplifier with the output of the differential amplifier controlling the conductance of a sink MOS transistor connected to the amplifier output. Another MOS transistor is serially connected with the second emitter follower transistor with the gate terminal connected to the differential amplifier output whereby an increasing sinking current causes an increase in current through the second emitter follower transistor and an increase of $V_{BE}$ of the transistor, thereby increasing $V_{BE}$ of the first emitter follower transistor.

4 Claims, 5 Drawing Sheets

CMOS AMPLIFIER HAVING ENHANCED CURRENT SINKING AND CAPACITANCE LOAD DRIVE

BACKGROUND OF THE INVENTION

This invention relates generally to linear electrical circuits, and more particularly the invention relates to a CMOS amplifier circuit having enhanced current sinking and capacitance load driving capability.

FIGS. 1A and 1B are schematics of a prior-art output stage circuit of an operational amplifier. An input signal is applied to the bases of two NPN transistors Q1 and Q2 which are connected between a positive potential (V+) and the inputs to an operational amplifier 10 (FIG. 1A). The output of amplifier 10 is connected to the gate of an MOS current sink transistor M7 which is serially connected with transistor Q2 between the positive and negative voltage potentials, V+ and V−, with the common terminal being the output of the amplifier stage. With reference to FIG. 1B, the differential amplifier 10 comprises two CMOS transistor pairs including p-channel transistors M3 and M4 and n-channel transistors M5 and M6. The emitter of transistor Q1 is connected to the gate of transistor M3, and the emitter of transistor Q2 is connected to the gate of transistor M4. A fixed current source, I1, serially connects transistor Q1 to the V− potential, while the current sink transistor M7 serially connects transistor Q2 to the V− potential.

This circuit provides low output impedance and delivers high output current to a load. However, a major shortcoming of the circuit is excessive phase shift when driving a capacitive load and when sinking moderate current at the same time. This presents a potential stability problem and oscillation of the amplifier. More particularly, when the output stage circuit sinks current from the load, a differential voltage, $\Delta V_{ba} = V_b - V_a$, develops between node a and node b and raises the voltage at node c high enough for transistor M7 to sink the output current. To increase the voltage at node c, the node a voltage has to become more negative than the voltage at node b. Since the bases of transistors Q1 and Q2 are tied together, the base-to-emitter bias voltage $V_{BE}$ of transistor Q2 is smaller than that of transistor Q1 by the amount of $\Delta V_{ba}$. With transistor Q1 conducting a constant current I1, the reduction of $V_{BE}$ bias voltage of transistor Q2 results in Q2 conducting less current than normal when not sinking or delivering output current. Since the transconductance of MOS transistors is normally low, the $\Delta V_{ba}$ can become so large for a moderate output sinking current that transistor Q2 conducts extremely low current and contributes excessive phase shift to the signal path, particularly when driving a capacitive load.

SUMMARY OF THE INVENTION

An object of the present invention is an amplifier output circuit of the described type having enhanced current sinking and capacitance drive capability.

A feature of the present invention is circuitry responsive to the sinking of increasing currents for maintaining the $V_{BE}$ bias voltage of transistor Q2 in the described amplifier circuit.

The invention and objects and features thereof will be more readily apparent from the following detailed description and appended claims when taken with the drawings.

DETAILED DESCRIPTION OF ILLUSTRATIVE EMBODIMENTS

Figure 1A:
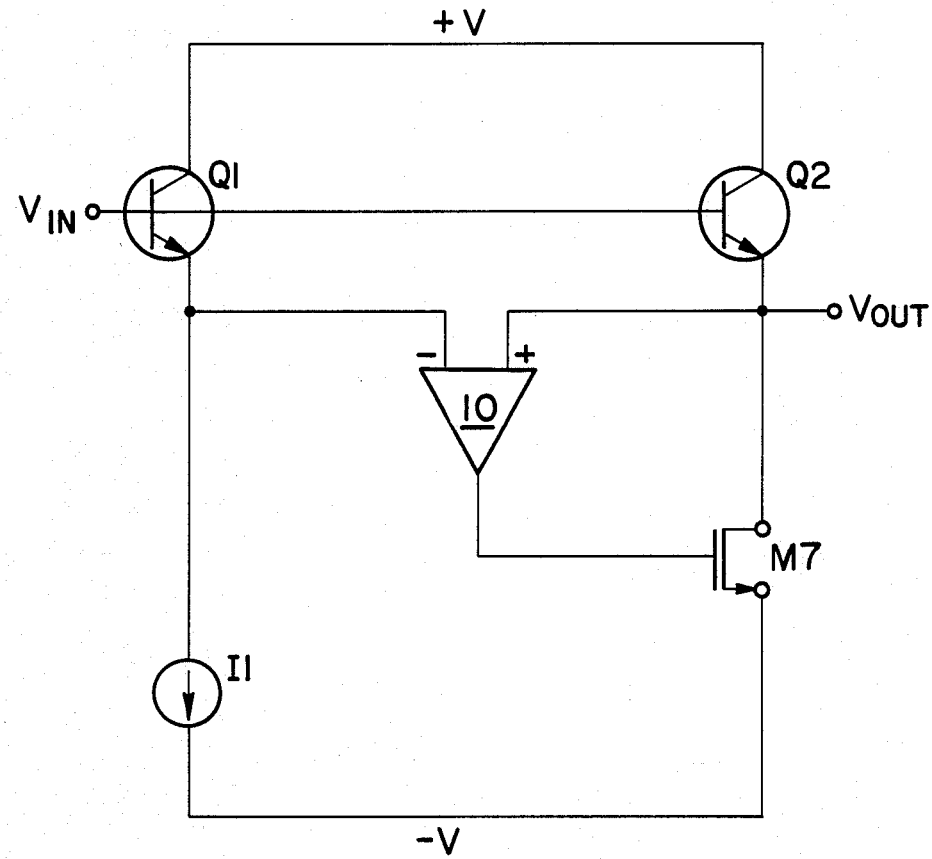
FIGS. 1A and 1B are schematics of a prior-art amplifier output stage as described above.
Figure 1B:
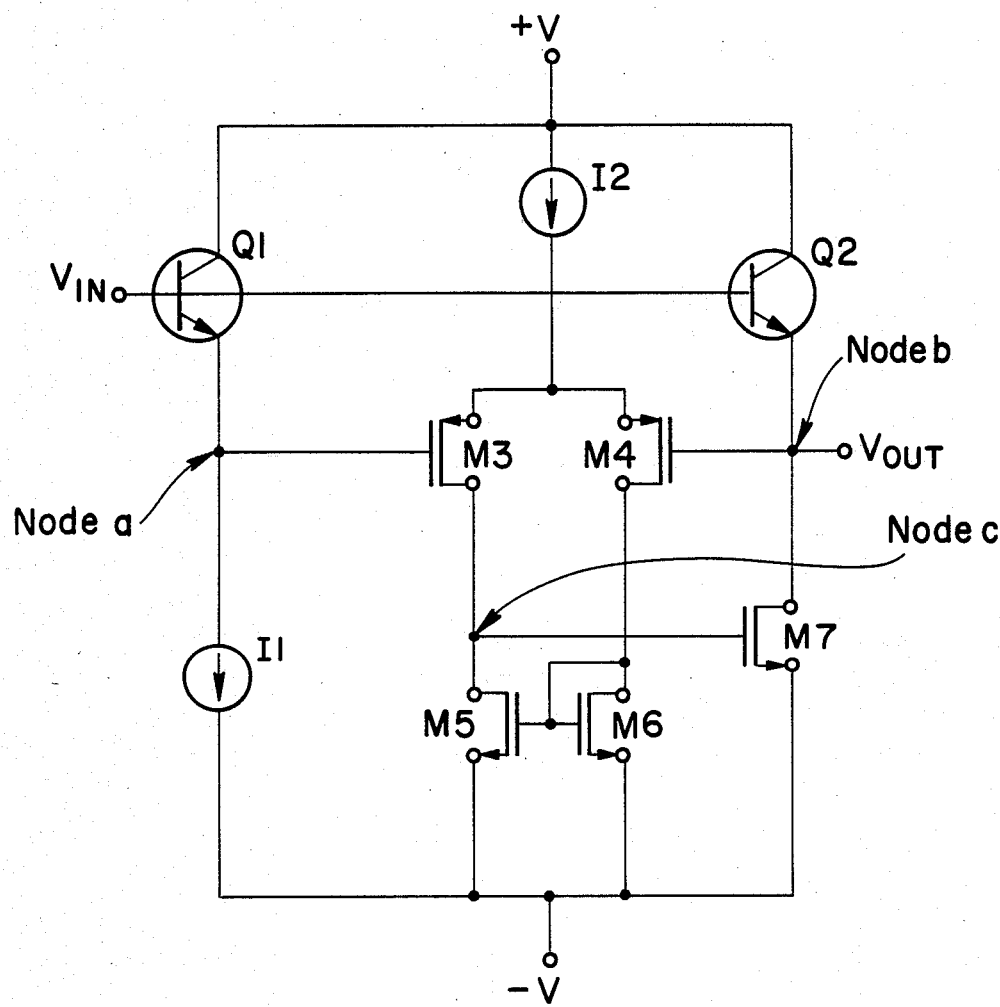
Figure 2:
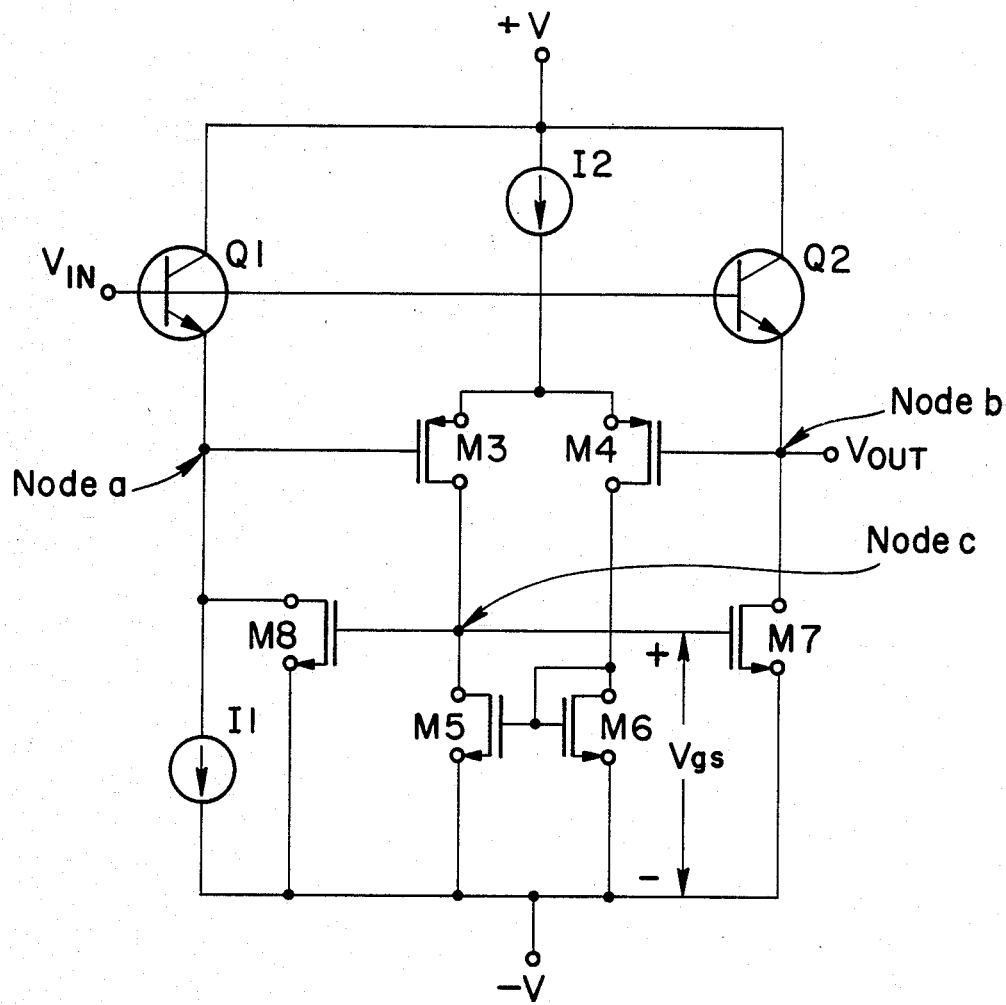
FIG. 2 is a schematic of the amplifier output stage of FIG. 1 as modified in accordance with the present invention.

FIG. 2 is a schematic of the operational amplifier output stage shown in FIG. 1 as modified in accordance with the present invention. Like elements have the same reference numerals. In this embodiment, an n-channel MOS transistor M8 is connected in parallel with the current source I1 with the channel size (w/L) of transistor M8 being typically much smaller than the channel size of the sink transistor M7. The gates of transistors M7 and M8 are connected to node c.

As transistor M7 sinks higher current, the node c voltage rises higher and transistor M8 conducts more current, proportional to the current of transistor M7, since transistors M7 and M8 have the same gate-to-source bias voltage, $V_{GS}$. The increase of transistor M8 current directly increases the current through transistor Q1, and with the increase of current, transistor Q1 has higher $V_{BE}$ bias voltage. The increase of this $V_{BE}$ bias voltage due to the current increase through transistor Q1 compensates for the reduction of $V_{BE}$ bias voltage of Q2 resulting from the differential voltage of nodes a and b ($\Delta V_{ba}$). Accordingly, a relatively constant current is maintained through transistor Q2 and prevents driving of the transistor to near turn-off. In this manner, the output stage circuit introduces little phase shift and provides a low output impedance and excellent output drive capability even as the sinking current increases.

Figure 3:
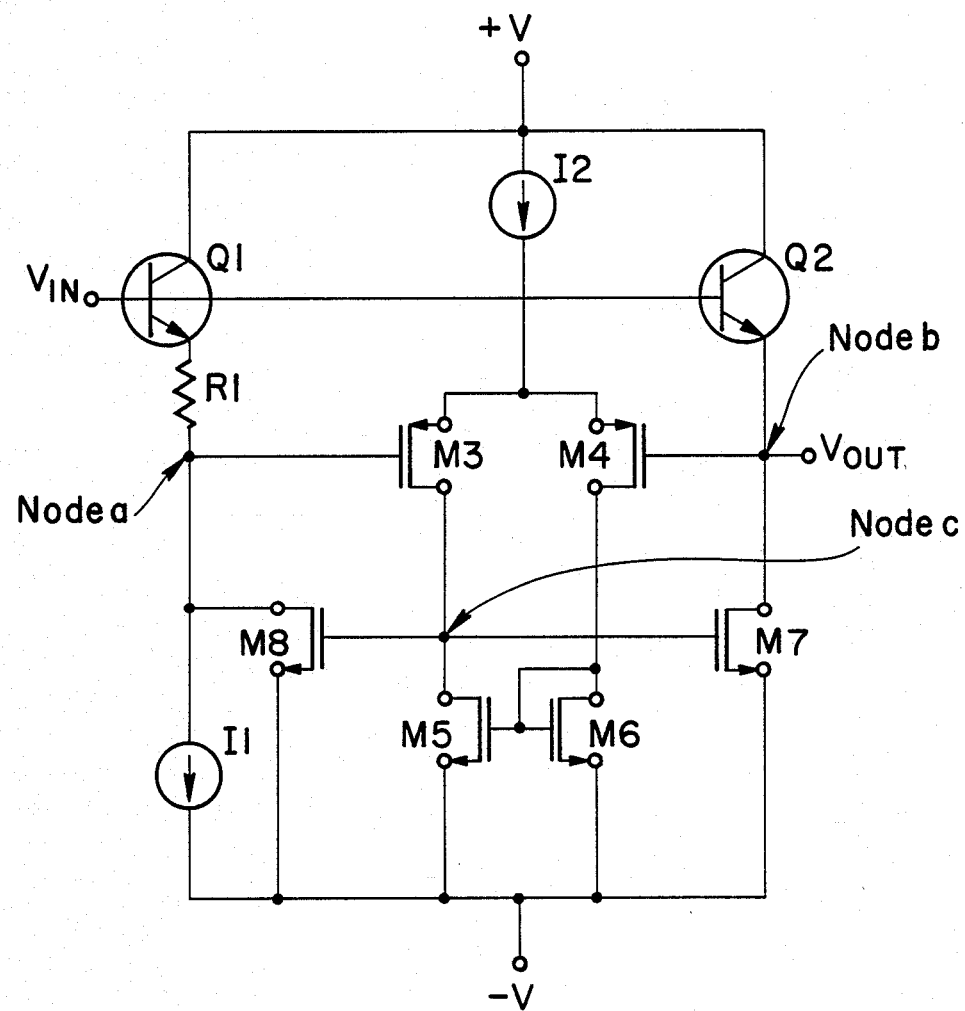
FIG. 3 is a schematic of the output amplifier circuit as further modified in accordance with another embodiment of the invention.

FIG. 3 is a schematic of the amplifier output stage of FIG. 2 which further includes a resistor R1 serially connected between transistor Q1 and node a. The function of resistor R1 is to increase the effective $V_{BE}$ of transistor Q2 as the sinking current increases. In this embodiment, transistors Q2, M3, M4, M5, M6 and M7 form a feedback loop. In order to maintain the loop stability, it is desirable to keep the loop bandwidth insensitive to circuit operational conditions. The transconductance of transistor M7 increases with increase in sink current passing therethrough. Therefore, if a constant loop gain and thus a constant loop bandwidth is to be maintained, the transconductance of transistor Q2 must be increased accordingly, with the current of transistor Q2 increasing with the increase of sinking current of transistor M7. By adding the resistor R1 to the emitter of transistor Q1, the voltage drop across R1 helps to increase the $V_{BE}$ bias voltage of transistor Q2, thereby increasing the current to transistor Q2 to an adequate level to achieve relatively constant loop bandwidth.

Figure 4:
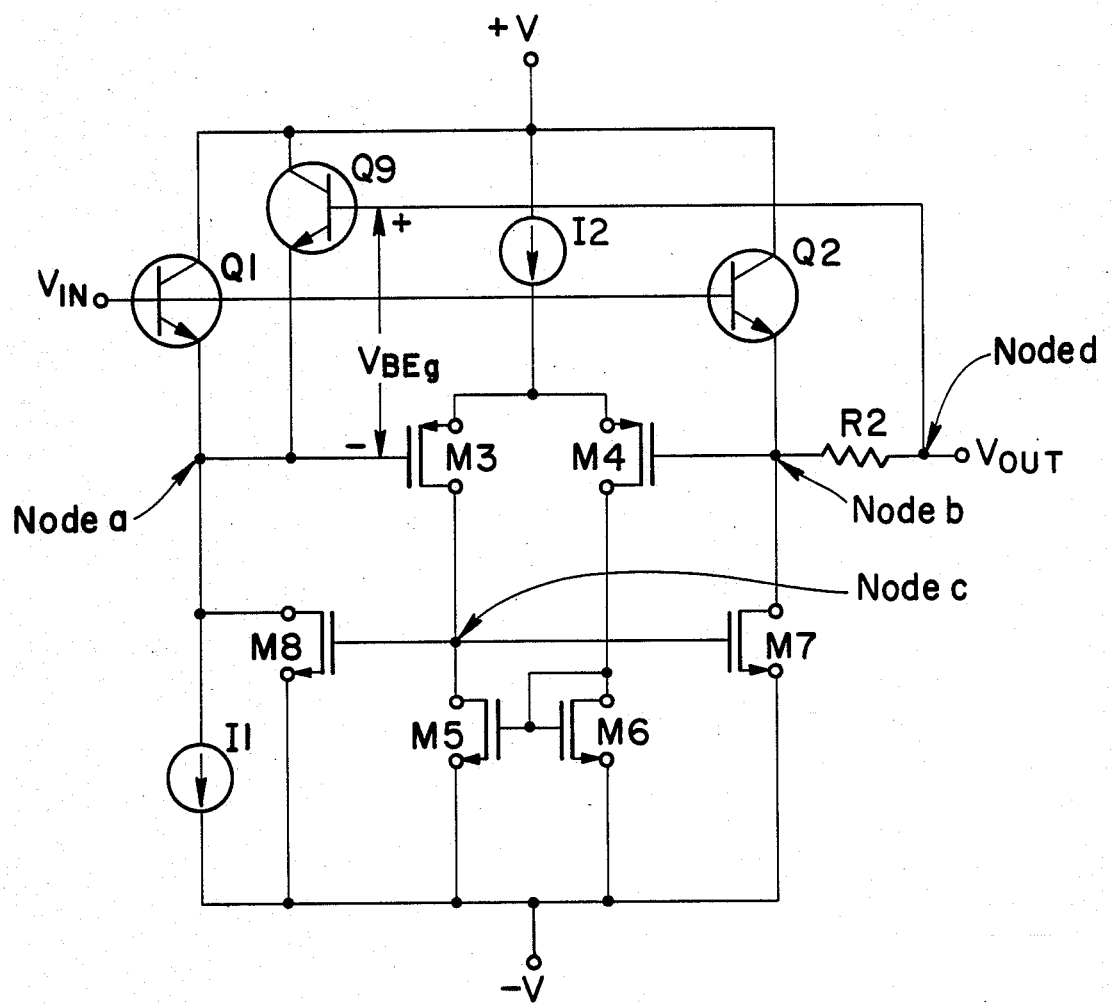
FIG. 4 is a schematic of the operational amplifier output stage as modified in accordance with yet another embodiment of the invention.

In another embodiment of the circuit in accordance with the invention, the circuitry as shown in FIG. 2 is modified to include a transistor Q9 connected in parallel with transistor Q1 as shown in FIG. 4. A resistor R2 is connected between the node b terminal and the output terminal, and the base voltage for transistor Q9 is taken at the output terminal. The resistor R2 provides two functions. First, the resistor isolates the output capacitive load from the output stage to suppress the tendency of circuit peaking and ringing and possible oscillation. Secondly, along with transistor Q9, the resistor sets the limit for the output sinking current. When the output stage sinks current from the load at normal operation, transistor Q9 is normally off and its base-to-emitter bias voltage $V_{BE9}$ consists of the voltage drop across R2 due to the output sinking current and the differential voltage $\Delta V_{ba} = V_b - V_a$. As the output stage receives a very strong drive and swings towards the negative rail, the voltage differential $\Delta V_{ba}$ increases and transistor M7 conducts more current, thereby increasing the voltage drop across resistor R2. The differential voltage $\Delta V_{ba}$ and the voltage drop across resistor R2 can be allowed to increase until the sum of these two voltages reaches a value of $V_{BE}$ for transistor Q9, for which current through transistor Q9 is equal to the current I1 plus the current of transistor M8 (a small fraction of the current through transistor M7). At this point, the current sinking through resistor R2 is the maximum current the output stage will sink. This maximum sinking current limit prevents the circuit from damage caused by the output node being shorted to a positive supply voltage.

The operational amplifier output stage circuit as modified in accordance with the present invention improves the performance of the circuit when sinking increasing currents and in driving capacitance loads. The circuit has been fabricated using standard MOS transistors and substrate NPN bipolar transistors. While the invention has been described with reference to a specific embodiments, the description is illustrative of the invention and not to be construed as limiting the invention. Various modifications and applications may occur to those skilled in the art without departing from the true spirit and scope of the invention as defined by the appended claims.

What is claimed is:

1. An amplifier output circuit comprising
   first and second bipolar transistors having collectors connected to a first voltage potential and bases connected to receive an input signal,
   a differential amplifier circuit having first and second inputs and an output,
   means connecting the emitter of said first bipolar transistor to one of said inputs and connecting the emitter of said second bipolar transistor to the other of said inputs,
   a first MOS transistor having source, gate and drain terminals with said drain terminal connected to said emitter of said second bipolar transistor, said source terminal connected to a second voltage potential and said gate connected to said output of said differential amplifier,
   a first fixed-current source connected between said emitter of said first bipolar transistor and said second voltage potential, and
   a second MOS transistor having source, gate and drain terminals with said drain terminal connected to said emitter of said first bipolar transistor and said source connected to said second voltage potential whereby said second MOS transistor is connected in parallel with said first fixed-current source, said gate of said second MOS transistor being connected to said output of said differential amplifier, whereby the base/emitter voltage of said first bipolar transistor increases as current through said first MOS transistor increases and offsets a decrease in $V_{BE}$ of said second bipolar transistor due to an increasing sink current.

2. The amplifier output circuit of claim 1 and further including resistive means interconnected between said emitter of said first bipolar transistor and said second MOS transistor.

3. The amplifier output circuit of claim 1 and further including resistive means having a first terminal connected to said emitter of said second bipolar transistor and to said drain terminal of said first MOS transistor and a second terminal connected to a circuit output terminal,
   a third bipolar transistor having a collector terminal connected to said first voltage potential, an emitter terminal connected to said first input of said differential amplifier whereby said third bipolar transistor is in parallel with said first bipolar transistor, and the base terminal of said third bipolar transistor connected to said circuit output.

4. The amplifier output circuit as defined by claim 1 wherein said differential amplifier circuit comprises first and second CMOS transistor pairs.

* * * * *